(12) United States Patent
Lee et al.

(10) Patent No.: US 7,564,140 B2
(45) Date of Patent: Jul. 21, 2009

(54) SEMICONDUCTOR PACKAGE AND SUBSTRATE STRUCTURE THEREOF

(75) Inventors: Wen-Hao Lee, Taichung Hsien (TW); Yu-Po Wang, Taichung Hsien (TW); Cheng-Hsu Hsiao, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 8 days.

(21) Appl. No.: 11/411,740

(22) Filed: Apr. 25, 2006

(65) Prior Publication Data

US 2007/0096336 A1  May 3, 2007

(30) Foreign Application Priority Data

Nov. 2, 2005  (TW)  ............. 94138370 A

(51) Int. Cl.
*H01L 23/48* (2006.01)
*H01L 23/52* (2006.01)
*H01L 29/40* (2006.01)

(52) U.S. Cl. .............. 257/783; 257/778; 257/787
(58) Field of Classification Search ............ 257/676, 257/783, 778, 787
See application file for complete search history.

(56) References Cited

U.S. PATENT DOCUMENTS

| | | | |
|---|---|---|---|
| 5,647,123 A * | 7/1997 | Greenwood et al. ......... 29/840 |
| 5,672,548 A | 9/1997 | Culnane et al. |
| 5,710,071 A * | 1/1998 | Beddingfield et al. ....... 438/108 |
| 6,008,534 A | 12/1999 | Fulcher |
| 6,225,704 B1 | 5/2001 | Sumita et al. |
| 6,372,544 B1 | 4/2002 | Halderman et al. |
| 6,667,557 B2 * | 12/2003 | Alcoe et al. ............. 257/778 |
| 7,102,239 B2 * | 9/2006 | Pu et al. ................. 257/778 |
| 2003/0210531 A1 * | 11/2003 | Alcoe et al. ............. 361/728 |
| 2004/0188836 A1 * | 9/2004 | Key et al. ............... 257/738 |
| 2005/0195582 A1 * | 9/2005 | Landeros et al. .......... 361/760 |
| 2005/0253275 A1 * | 11/2005 | Hsu ..................... 257/778 |

* cited by examiner

*Primary Examiner*—S. V Clark
(74) *Attorney, Agent, or Firm*—Peter F. Corless; Steven M. Jensen; Edwards Angell Palmer & Dodge LLP

(57) ABSTRACT

A semiconductor package and a substrate structure thereof are provided. A solder mask layer applied on the substrate structure is formed with outwardly extended openings corresponding to corner portions of a chip mounting area of the substrate structure. When a flip-chip semiconductor chip is mounted on the chip mounting area and an underfilling process is performed, an underfill material can fill a gap between the flip-chip semiconductor chip and the substrate structure, and effectively fill the outwardly extended openings of the solder mask layer corresponding to the corner portions of the chip mounting area so as to provide sufficient protection for corners of the flip-chip semiconductor chip and prevent delamination at the corners of the flip-chip semiconductor chip during a subsequent thermal cycle.

12 Claims, 8 Drawing Sheets

SEMICONDUCTOR PACKAGE AND SUBSTRATE STRUCTURE THEREOF

FIELD OF THE INVENTION

The present invention relates to semiconductor packages and substrate structures thereof, and more particularly, to a flip-chip semiconductor package and a substrate structure thereof for preventing delamination of the semiconductor package.

BACKGROUND OF THE INVENTION

Flip-chip semiconductor package is formed by mounting and electrically connecting an active surface of at least one chip to a surface of a substrate via a plurality of solder bumps through the use of a flip-chip technique, and implanting a plurality of solder balls serving as input/output (I/O) connections on another surface of the substrate to allow the chip to be electrically connected to an external device via the solder balls. The flip-chip semiconductor package is advantageous of having a reduced size to make the chip and the substrate similar in scale and avoiding the use of bonding wires to thereby reduce resistance and improve electrical performance thereof, such that the flip-chip semiconductor package is widely used.

FIGS. 1A and 1B show a conventional flip-chip semiconductor package, which requires filling of an underfill material 12 (such as a thermosetting material) between a chip 10 and a substrate 11 on which the chip 10 is mounted so as to allow the underfill material 12 to encapsulate solder bumps 13 that electrically connect the chip 10 to the substrate 11, such that the solder bumps 13 are enhanced in strength, secured in place and prevented from deformation as well as can support the weight of the chip 10. The underfilling process has been disclosed in prior technologies such as U.S. Pat. Nos. 5,672,548 and 6,008,534.

Due to surface tension of the underfill material 12 filled between the chip 10 and the substrate 11, the four corners of the chip 10 are covered by a relatively smaller or the smallest amount of the underfill material 12 (as indicated by S in FIG. 1A) as compared to other areas of the chip 10. Further, due to a great mismatch in coefficient of thermal expansion (CTE) between a material of the chip 10 and a material of the substrate 11, thermal stress and thermal deformation are proportional to distance L in a thermal cycle during fabrication of the semiconductor package, that is, $\delta$ (quantity of deformation) =$\alpha$ (CTE)×L (distance from a position where $\delta$ is zero)×$\Delta t$ (quantity of temperature change). In other words, a corner position of the chip 10 would experience the maximum thermal stress and thermal deformation as the corner position has the furthest distance from a central position of the chip 10 where the quantity of deformation $\delta$ is zero. However, the underfill material 12 cannot provide sufficient protection at the corner position of the chip 10 as not being covered by a sufficient amount of the underfill material 12, thereby making the corner position of the chip 10 delaminate from the underfill material 12 (as indicated by S' in FIG. 1A) and adversely affecting the quality of underfilling. The electrical performance of the solder bumps may even be deteriorated if the delamination spreads.

Accordingly, as disclosed in U.S. Pat. Nos. 6,225,704 and 6,372,544, a fillet 24 is provided around the underfill material 22 to encapsulate the underfill material 22 and improve the protection effect as shown in FIG. 2.

However, to have the arrangement of FIG. 2, an additional process of applying the fillet 24 around the underfill material 22 after completing the underfilling process is required, which undesirably increases the time, steps and cost in fabrication and easily causes flashes of the fillet 24.

FIGS. 3A to 3C show another type of underfiling technology as disclosed in U.S. Pat. No. 5,892,289. By this type of underfiling technology, a sealing resin 32 is applied at the four corners of a chip mounting area on a substrate 31, and then a chip 30 is mounted and electrically connected to the chip mounting area of the substrate 31, allowing the sealing resin 32 applied on the corners of the chip mounting area to slowly flow towards the center of the chip mounting area and fill a gap between the chip 30 and the substrate 31 by capillary action. As a result, the four corners of the chip 30 can be covered by more resin and thus provided with better protection.

However, during practical implementation, it is difficult to control the amount of resin formed on the corners of the chip mounting area and the fluidity of resin through the capillary action, which may cause an insufficient amount of resin filled between the chip and the substrate such that bonding quality of the chip and the substrate is degraded, or cause an excessive amount of resin filled between the chip and the substrate such that bond pads on the substrate could be contaminated by the resin, thereby adversely affecting the reliability of the fabricated packaged product.

Therefore, the problem to be solved here is to provide a flip-chip semiconductor device for preventing delamination at corners of a chip incorporated in the semiconductor device.

SUMMARY OF THE INVENTION

In light of the foregoing drawbacks of the prior art, an objective of the present invention is to provide a semiconductor package and a substrate structure thereof, which can prevent delamination of a chip incorporated in the semiconductor package.

Another objective of the present invention is to provide a semiconductor package and a substrate structure thereof, which can prevent delamination at corners of a chip incorporated in the semiconductor package.

Still another objective of the present invention is to provide a semiconductor package and a substrate structure thereof, which can increase an amount of an underfilling material formed at corners of a chip incorporated in the semiconductor package.

A further objective of the present invention is to provide a semiconductor package and a substrate structure thereof, which can prevent delamination at corners of a chip incorporated in the semiconductor package without requiring an additional fabrication process.

A further objective of the present invention is to provide a semiconductor package and a substrate structure thereof, which can eliminate problems of resin flashes and unsatisfactory bonding quality between a chip and a substrate caused by difficulty in controlling an amount and fluidity of a resin applied on a chip mounting area of the substrate.

In order to achieve the foregoing and other objectives, the present invention proposes a semiconductor package comprising: a substrate structure formed with at least one chip mounting area and covered with a solder mask layer thereon, wherein the solder mask layer is formed with outwardly extended openings corresponding to corner portions of the chip mounting area; at least one flip-chip semiconductor chip mounted on the chip mounting area of the substrate structure; and an underfill material for filling a gap between the flip-chip semiconductor chip and the substrate structure and the outwardly extended openings of the solder mask layer corresponding to the corner portions of the chip mounting area. The outwardly extended openings of the solder mask layer can be connected to each other or independent from each other.

The present invention also proposes a substrate structure used in the foregoing semiconductor package. The substrate structure is formed with at least one chip mounting area for accommodating a semiconductor chip, and a surface of the substrate surface is applied with a solder mask layer having a plurality of outwardly extended openings corresponding to corner portions of the chip mounting area.

Therefore, in the semiconductor package and the substrate structure provided by the present invention, a plurality of outwardly extended openings are formed in a solder mask layer applied on the substrate structure and at positions corresponding to corner portions of a chip mounting area of the substrate structure. When a flip-chip semiconductor chip is mounted and electrically connected to the chip mounting area of the substrate structure and an underfilling process is performed, an underfill material can fill a gap between the semiconductor chip and the substrate structure and effectively fill the outwardly extended openings corresponding in position to the corner portions of the chip mounting area, so as to provide sufficient protection for corners of the semiconductor chip by the underfill material filling the outwardly extended openings corresponding in position to the corner portions of the chip mounting area, such that delamination at the corners of the semiconductor chip during a subsequent thermal cycle can be prevented.

Moreover, by using the substrate structure of the present invention, the arrangement of forming the outwardly extended openings in the solder mask layer at positions corresponding to the corner portions of the chip mounting area allows the underfill material to effectively fill the outwardly extended openings and provide protection for the corners of the semiconductor chip, such that a resistant effect against thermal stress is provided by the underfill material to prevent delamination at the corners of the semiconductor chip without the need of additional fabrication equipment and process. Furthermore, the present invention can eliminate the prior-art problems of unsatisfactory bonding quality between a chip and a substrate and flashes of a resin due to difficulty in controlling an amount and fluidity of the resin applied on a chip mounting area of the substrate.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package and a substrate structure thereof proposed in the present invention are described as follows with reference to FIGS. 4-7. It should be noted that the drawings are simplified schematic diagrams and only show elements related to the present invention, and the arrangement or layout of the elements could be more complicated in practical implementation.

Figure 1A:
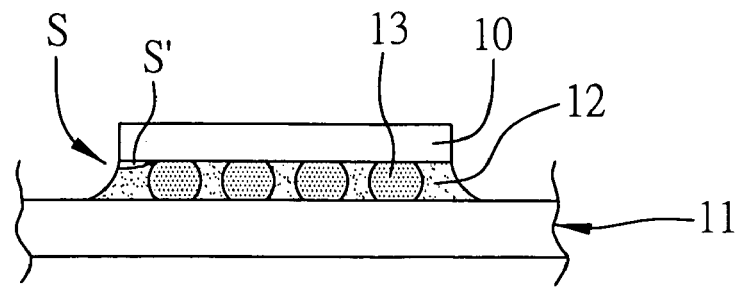
FIG. 1A (PRIOR ART) is a schematic cross-sectional diagram showing a conventional flip-chip semiconductor package.
Figure 1B:
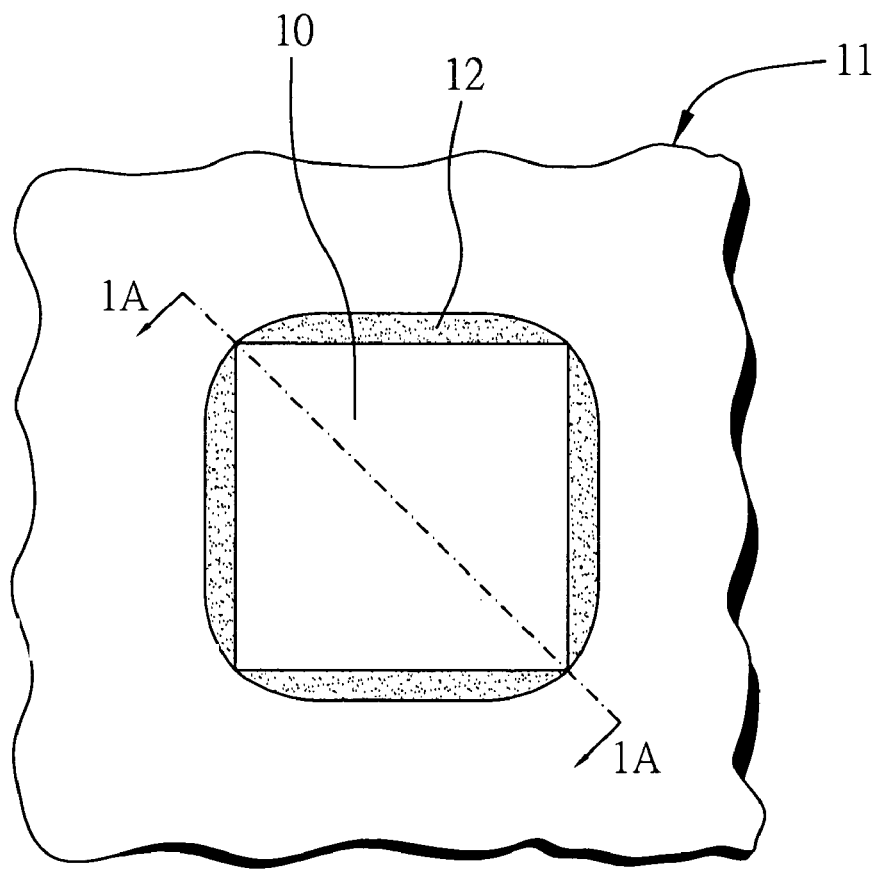
FIG. 1B (PRIOR ART) is a top view of the conventional flip-chip semiconductor package shown in FIG. 1A.
Figure 2:
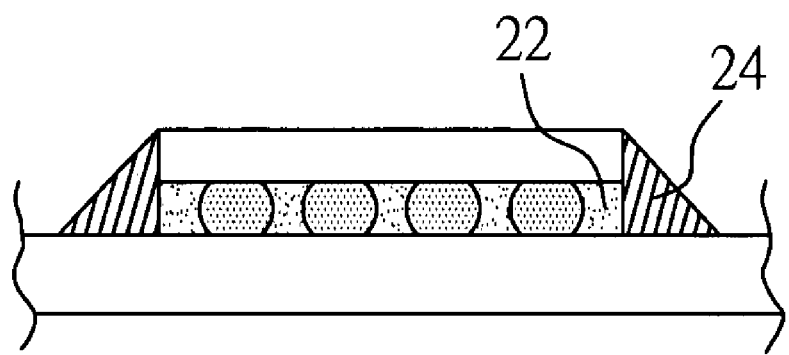
FIG. 2 (PRIOR ART) is a schematic cross-sectional diagram showing a flip-chip semiconductor package disclosed in U.S. Pat. No. 6,225,704.
Figure 3A:
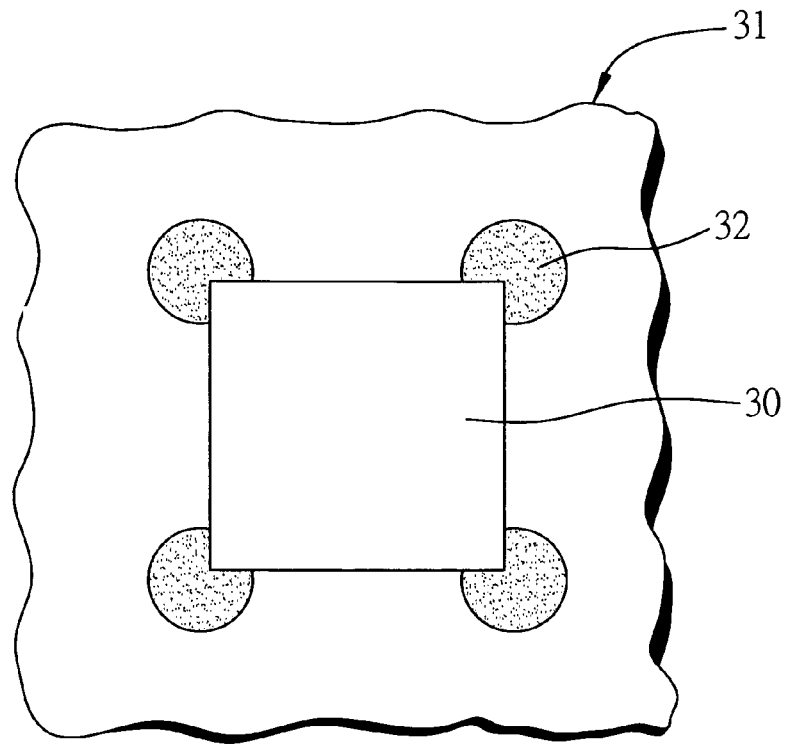
FIGS. 3A to 3C (PRIOR ART) are schematic diagrams showing steps of an underfilling process disclosed in U.S. Pat. No. 5,892,289.
Figure 3B:
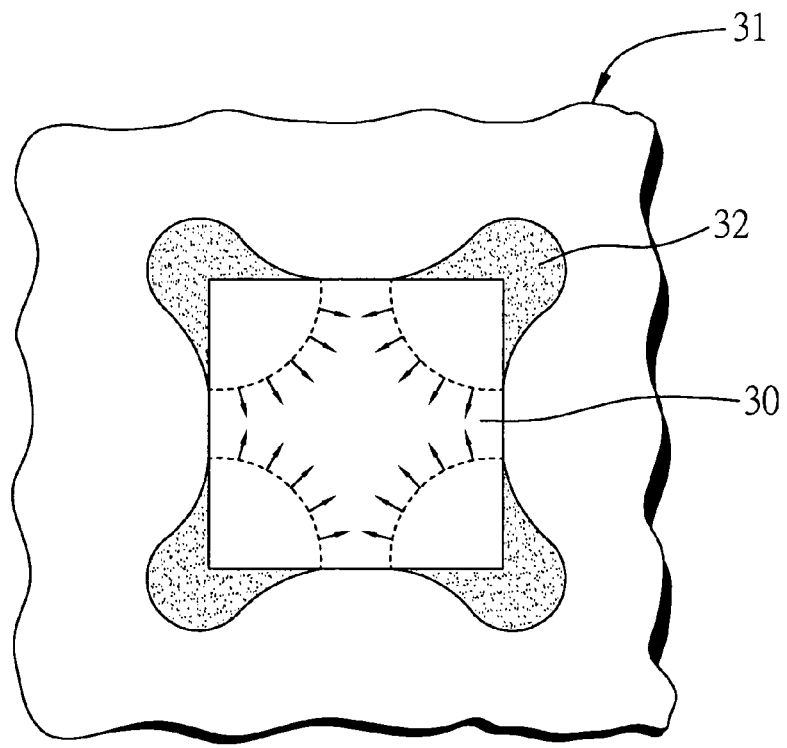
Figure 3C:
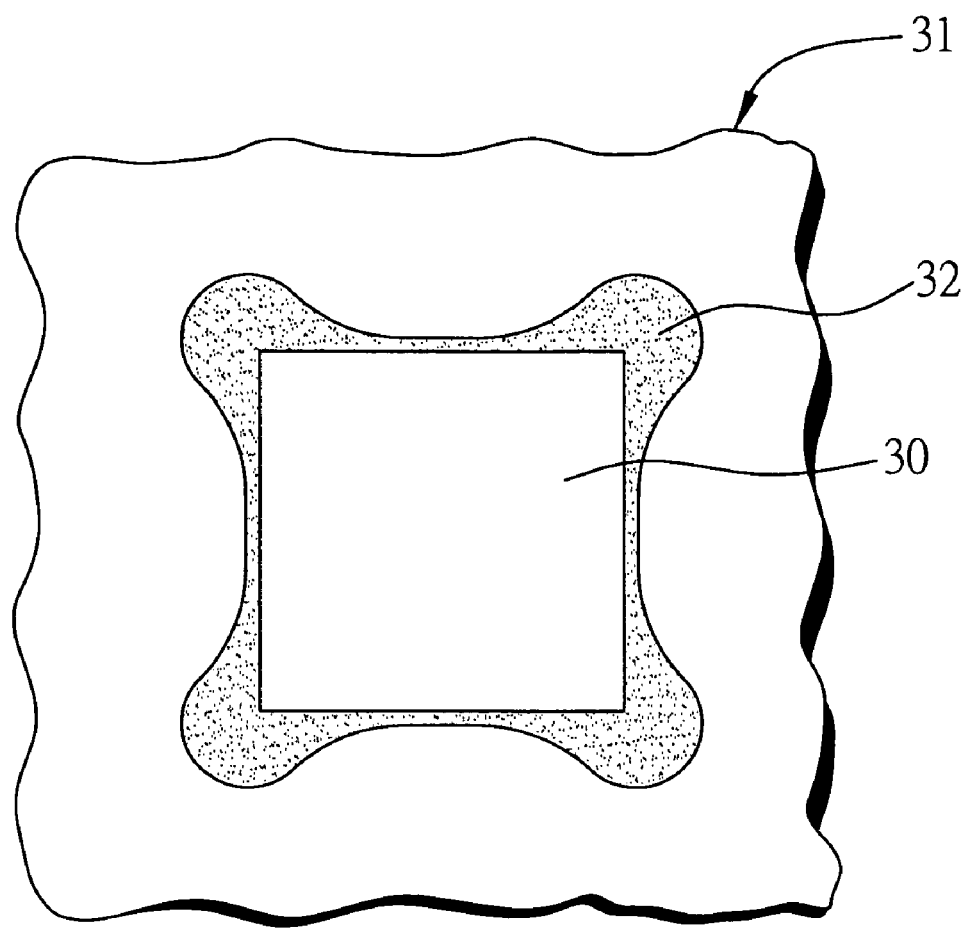
Figure 4A:
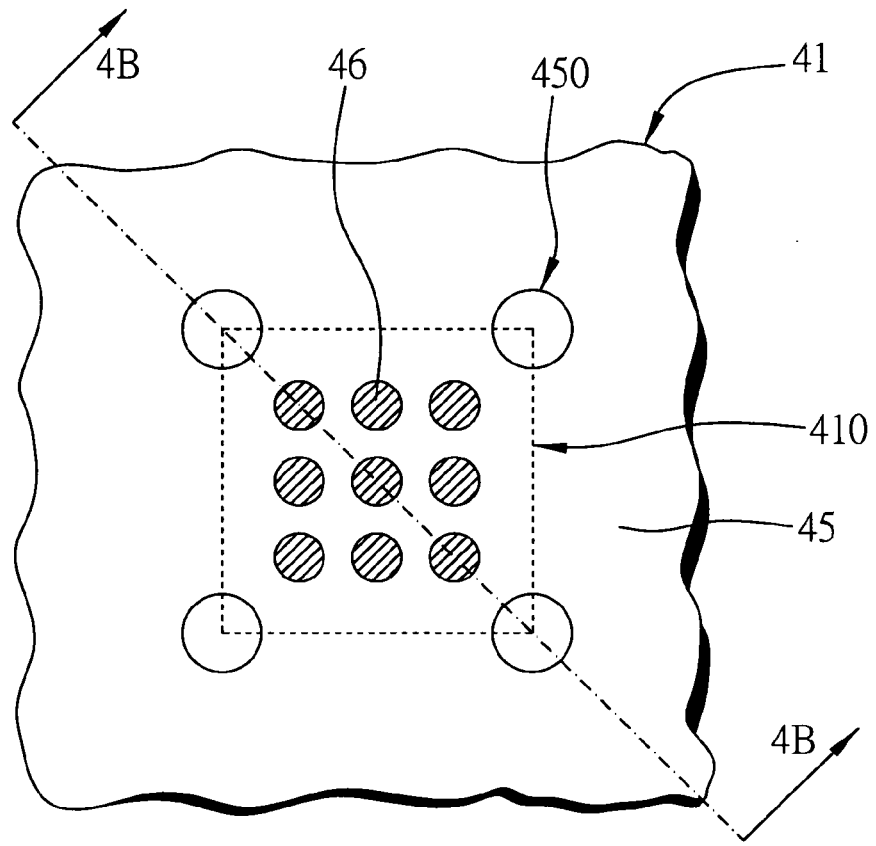
FIGS. 4A and 4B are a top view and a cross-sectional view of a substrate structure according to a first preferred embodiment of the present invention respectively.
Figure 4B:
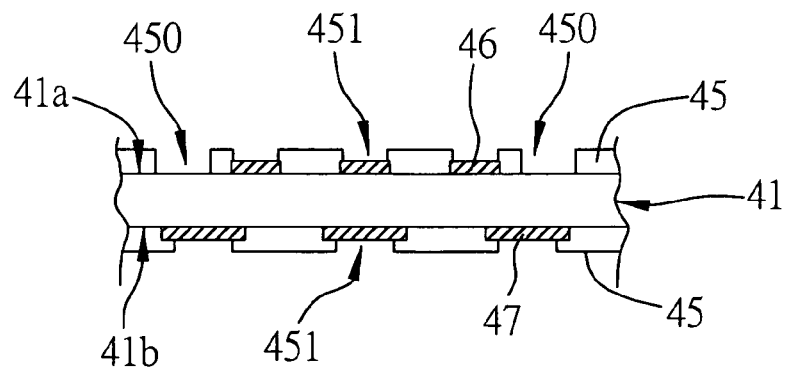

FIGS. 4A and 4B are a top view and a cross-sectional view of a substrate structure according to a first preferred embodiment of the present invention respectively.

As shown in the drawings, the substrate structure 41 has a first surface 41a and an opposing second surface 41b. At least one chip mounting area 410 for accommodating a semiconductor chip is formed on the first surface 41a of the substrate structure 41, and the first surface 41a of the substrate structure 41 is covered with a solder mask layer 45, wherein the solder mask layer 45 is formed with a plurality of outwardly extended openings 450 corresponding in position to corner portions of the chip mounting area 410.

The first surface 41a of the substrate structure 41 is further formed with a plurality of first bond pads 46 and conductive traces (not shown) thereon, and the second surface 41b of the substrate structure 41 is formed with a plurality of second bond pads 47 and conductive traces (not shown) thereon. The first bond pads 46 are located within the chip mounting area 410 of the substrate structure 41, for subsequently allowing a flip-chip semiconductor chip to be attached and electrically connected to the first bond pads 46. The second bond pads 47 on the second surface 41b of the substrate structure 41 are used for subsequently implanting solder balls, such that the flip-chip semiconductor chip mounted on the chip mounting area of the first surface of the substrate structure can be electrically connected to an external device via the solder balls.

In practical implementation, in order to prevent contamination on the first and second bond pads 46, 47 and conductive traces, besides the first surface 41a of the substrate structure 41, the second surface 41b of the substrate structure 41 is also covered with the solder mask layer 45. The solder mask layer 45 is further formed with a plurality of openings 451 for exposing the first and second bond pads 46, 47, such that the flip-chip semiconductor chip can be mounted to the first bond pads 46 via solder bumps and the solder balls can be implanted to the second bond pads 47.

As described above, the solder mask layer 45 has the plurality of outwardly extended openings 450 corresponding in position to the corner portions of the chip mounting area 410. The outwardly extended openings 450 are independent from each other and individually formed on the corner portions of the chip mounting area 410. When the flip-chip semiconductor chip is mounted to the first bond pads 46 via the solder bumps and an underfilling process is performed, an underfill material can effectively fill the outwardly extended openings 450 corresponding in position to the corner portions of the chip mounting area 410 to be applied to corners of the flip-chip semiconductor chip and thereby provide a resistance effect against thermal stress at the corners of the flip-chip semiconductor chip.

Figure 5A:
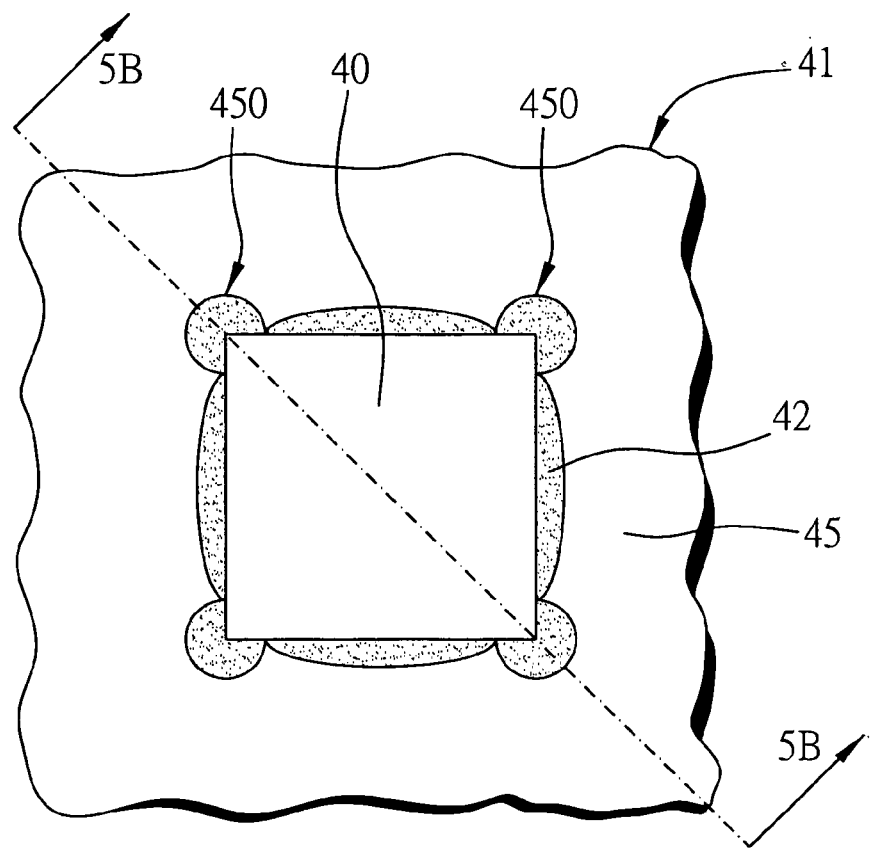
FIGS. 5A and 5B are a top view and a cross-sectional view of a semiconductor package according to the first preferred embodiment of the present invention respectively.
Figure 5B:
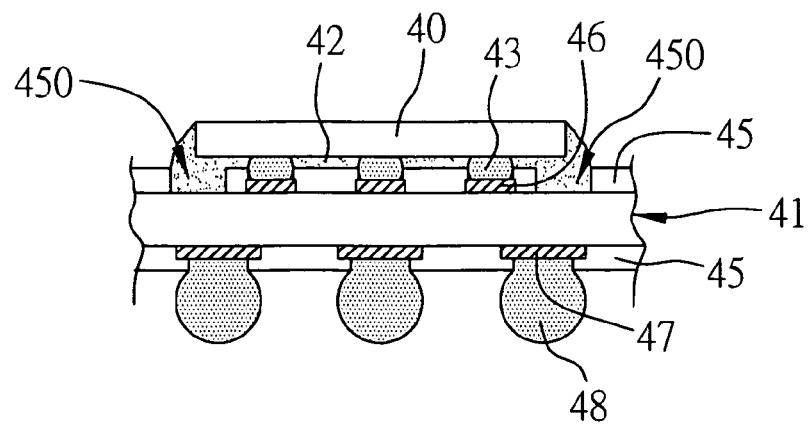

FIGS. 5A and 5B are a top view and a cross-sectional view of a semiconductor package according to the first preferred embodiment of the present invention respectively. The semiconductor package is a flip-chip semiconductor package using the substrate structure shown in FIGS. 4A and 4B.

As shown in FIGS. 5A and 5B, the semiconductor package comprises: a substrate structure 41 formed with at least one chip mounting area 410 and covered with a solder mask layer 45, wherein the solder mask layer 45 is formed with a plurality of outwardly extended openings 450 at positions corresponding to corner portions of the chip mounting area 410; at least one flip-chip semiconductor chip 40 mounted on the chip mounting area 410; and an underfill material 42 for filling a gap between the flip-chip semiconductor chip 40 and the substrate structure 41 and the outwardly extended openings 450 of the solder mask layer 45 corresponding in position to the corner portions of the chip mounting area 410.

The flip-chip semiconductor chip 40 is mounted on the chip mounting area 410 via a plurality of solder bumps 43 by a flip-chip technique, wherein an active surface of the flip-chip semiconductor chip 40 is electrically connected to the first bond pads 46 of the chip mounting area 410 on the first surface of the substrate structure 41 via the solder bumps 43. The gap between the flip-chip semiconductor chip 40 and the substrate structure 41 is filled with the underfill material 42, wherein the underfill material 42 encapsulates the plurality of solder bumps 43 and fill the outwardly extended openings 450 of the solder mask layer 45 corresponding to the corner portions of the chip mounting area 410, such that the underfill material 42 can be effectively applied to corners of the flip-chip semiconductor chip 40 and provide a resistant effect against thermal stress at the corners of the flip-chip semiconductor chip 40. Moreover, solder balls 48 can be implanted to the second bond pads 47 on the second surface of the substrate structure 41, so as to form a flip-chip ball grid array (FCBGA) semiconductor package.

Figure 6:
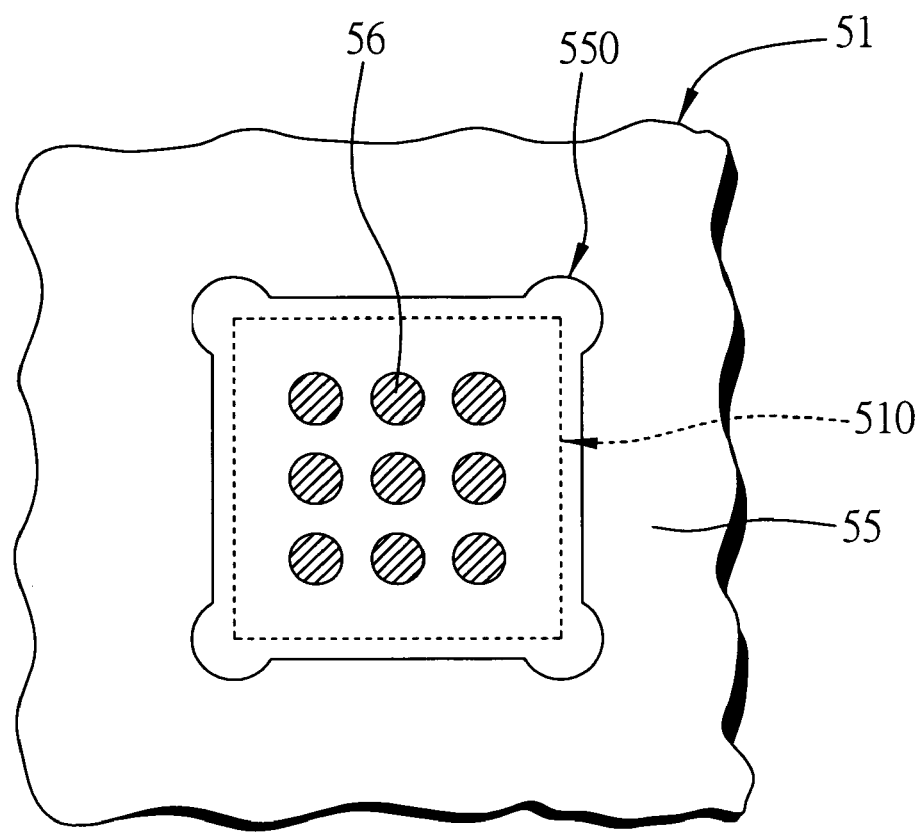
FIG. 6 is a top view of a substrate structure according to a second preferred embodiment of the present invention.
Figure 7A:
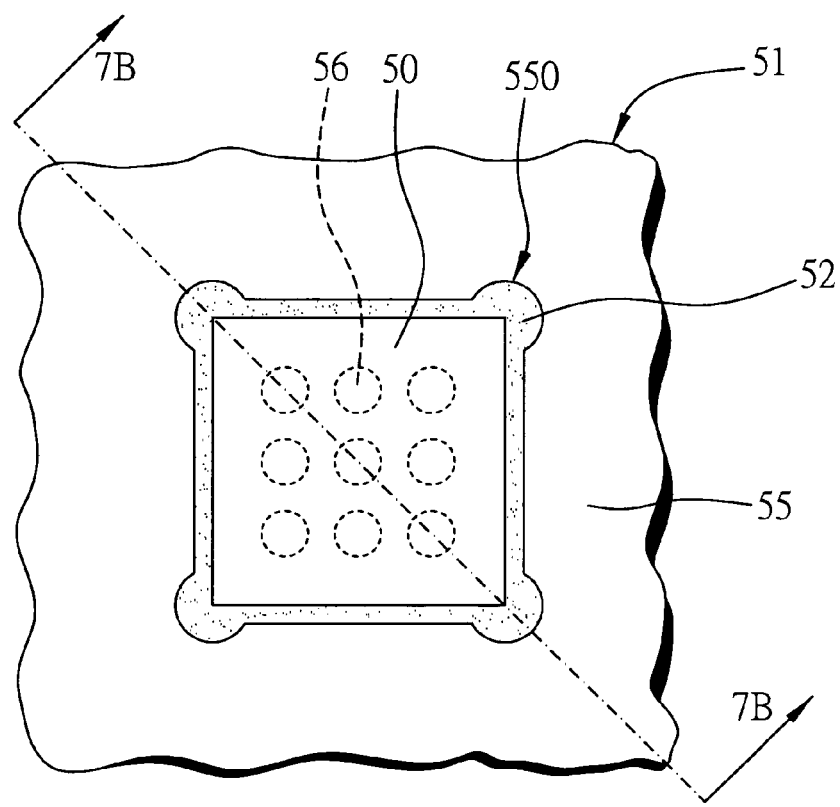
FIGS. 7A and 7B are a top view and a cross-sectional view of a semiconductor package according to the second preferred embodiment of the present invention respectively.
Figure 7B:
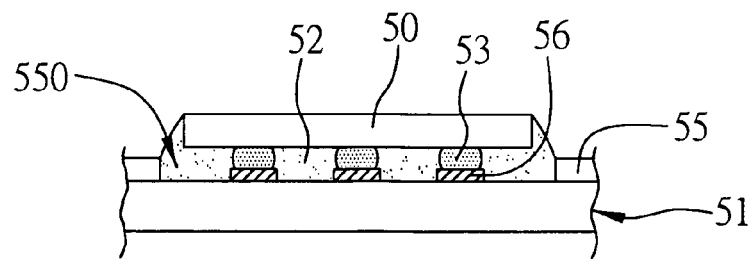

FIG. 6 shows a substrate structure according to a second preferred embodiment of the present invention, and FIGS. 7A and 7B showing a semiconductor package according to the second preferred embodiment of the present invention through the use of the substrate structure in FIG. 6.

The substrate structure and the semiconductor package of the second embodiment are substantially similar to those of the foregoing first embodiment. A primary difference between the first and second embodiments is that the solder mask layer in the second embodiment is formed with a connecting opening for exposing the chip mounting area, wherein the connecting opening includes the outwardly extended openings corresponding to the corner portions of the chip mounting area as disclosed in the first embodiment and allowing the outwardly extended openings to be connected to each other.

As shown in FIGS. 6, 7A and 7B, the solder mask layer 55 applied on the surface of the substrate structure 51 is formed with a connecting opening 550 for completely exposing the chip mounting area 510, wherein the connecting opening 550 has outwardly extended portions corresponding to the corner portions of the chip mounting area 510, and the outwardly extended portions of the connecting opening 550 correspond to the outwardly extended openings of the solder mask layer as described in the foregoing first embodiment. The bond pads 56 formed on the surface of the substrate structure 51 are completely exposed via the connecting opening 550, such that the flip-chip semiconductor chip 50 can be mounted and electrically connected to the bond pads 56 via the plurality of solder bumps 53. As the connecting opening 550 has the outwardly extended portions corresponding to the corner portions of the chip mounting area 510, during the underfilling process, the underfill material 52 can effectively fill the connecting opening 550 and the outwardly extended portions thereof to be applied to the corners of the flip-chip semiconductor chip 50, without causing flashes of the underfill material 52, and thereby providing a resistant effect against thermal stress at the corners of the flip-chip semiconductor chip 50.

Therefore, in the semiconductor package and the substrate structure provided by the present invention, a plurality of outwardly extended openings are formed in a solder mask layer applied on the substrate structure and at positions corresponding to corner portions of a chip mounting area of the substrate structure. When a flip-chip semiconductor chip is mounted and electrically connected to the chip mounting area of the substrate structure and an underfilling process is performed, an underfill material can fill a gap between the semiconductor chip and the substrate structure and effectively fill the outwardly extended openings corresponding in position to the corner portions of the chip mounting area, so as to provide sufficient protection for corners of the semiconductor chip by the underfill material filling the outwardly extended openings corresponding in position to the corner portions of the chip mounting area, such that delamination at the corners of the semiconductor chip during a subsequent thermal cycle can be prevented.

Moreover, by using the substrate structure of the present invention, the arrangement of forming the outwardly extended openings in the solder mask layer at positions corresponding to the corner portions of the chip mounting area allows the underfill material to effectively fill the outwardly extended openings and provide protection for the corners of the semiconductor chip, such that a resistant effect against thermal stress is provided by the underfill material to prevent delamination at the corners of the semiconductor chip without the need of additional fabrication equipment and processes. Furthermore, the present invention can eliminate the prior-art problems of unsatisfactory bonding quality between a chip and a substrate and flashes of a resin due to difficulty in controlling an amount and fluidity of the resin applied on a chip mounting area of the substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package comprising:
   a substrate structure having at least one chip mounting area and covered with a solder mask layer, wherein the solder mask layer is formed with a plurality of outwardly extended openings corresponding to corner portions of the chip mounting area, and the outwardly extended openings are independent from each other and are not connected to each other;
   at least one flip-chip semiconductor chip mounted on the chip mounting area of the substrate structure; and
   an underfill material for filling a gap between the flip-chip semiconductor chip and the substrate structure and the outwardly extended openings of the solder mask layer corresponding to the corner portions of the chip mounting area.

2. The semiconductor package of claim 1, wherein the substrate structure has a first surface and an opposing second surface, with the chip mounting area being formed on the first surface of the substrate structure.

3. The semiconductor package of claim 2, wherein the first surface of the substrate structure is further formed with a plurality of first bond pads within the chip mounting area, allowing the flip-chip semiconductor chip to be attached and electrically connected to the first bond pads via solder bumps.

4. The semiconductor package of claim 3, wherein the solder mask layer is applied on the first surface of the substrate structure, and the first bond pads on the first surface of the substrate structure are exposed from the solder mask layer, allowing the flip-chip semiconductor chip to be attached and electrically connected to the first bond pads via the solder bumps.

5. The semiconductor package of claim 2, wherein the second surface of the substrate structure is formed with a plurality of second bond pads where solder balls are implanted.

6. The semiconductor package of claim 5, wherein the solder mask layer is applied on the second surface of the substrate structure, and the second bond pads on the second surface of the substrate structure are exposed from the solder mask layer, allowing the solder balls to be implanted to the second bond pads.

7. A substrate structure comprising at least one chip mounting area for accommodating a flip-chip semiconductor chip, and a solder mask layer applied on the substrate structure, wherein the solder mask layer is formed with a plurality of outwardly extended openings corresponding to corner portions of the chip mounting area, and the outwardly extended openings are independent from each other are not connected to each other.

8. The substrate structure of claim 7, wherein the substrate structure has a first surface and an opposing second surface, with the chip mounting area being formed on the first surface of the substrate structure.

9. The substrate structure of claim 8, wherein the first surface of the substrate structure is further formed with a plurality of first bond pads within the chip mounting area, allowing the flip-chip semiconductor chip to be attached and electrically connected to the first bond pads via solder bumps.

10. The substrate structure of claim 9, wherein the solder mask layer is applied on the first surface of the substrate structure, and the first bond pads on the first surface of the substrate structure are exposed from the solder mask layer, allowing the flip-chip semiconductor chip to be attached and electrically connected to the first bond pads via the solder bumps.

11. The substrate structure of claim 8, wherein the second surface of the substrate structure is formed with a plurality of second bond pads, allowing solder balls to be implanted to the second bond pads.

12. The substrate structure of claim 11, wherein the solder mask layer is applied on the second surface of the substrate structure, and the second bond pads on the second surface of the substrate structure are exposed from the solder mask layer, allowing the solder balls to be implanted to the second bond pads.

* * * * *